United States Patent [19]

Bass et al.

[11] Patent Number: 5,027,014

[45] Date of Patent: Jun. 25, 1991

[54] TRANSLATOR CIRCUIT AND METHOD OF OPERATION

[75] Inventors: Alan S. Bass, Plano; Stephen R. Schenck, McKinney; Robert C. Martin, Dallas, all of Tex.

[73] Assignee: Texas Instruments Incorporated, Dallas, Tex.

[21] Appl. No.: 502,471

[22] Filed: Mar. 30, 1990

[51] Int. Cl.$^5$ ............... H03K 19/092; H03K 19/094; H03K 19/086; H03K 19/003

[52] U.S. Cl. ..................... 307/475; 307/270; 307/443; 307/446; 307/451; 307/310; 323/315

[58] Field of Search ............... 307/475, 443, 451, 446, 307/310, 270, 570, 448, 544; 323/315

[56] References Cited

U.S. PATENT DOCUMENTS

| | | | |
|---|---|---|---|
| 4,890,019 | 12/1989 | Hoyte et al. | 307/475 |
| 4,902,915 | 2/1990 | Tran | 307/475 X |
| 4,914,321 | 4/1990 | Davis | 307/475 X |

OTHER PUBLICATIONS

Article entitled "A 350 ps 50K 0.8 μm BiCMOS Gate Array with Shared Bipolar Cell Structure" by Horoguki Hara et al. of Toshiba Corporation which appeared in 1989 IEEE Custom Integrated Circuits Conference.

Primary Examiner—Stanley D. Miller
Assistant Examiner—David R. Bertelson
Attorney, Agent, or Firm—B. Peter Barndt; James T. Comfort; Melvin Sharp

[57] ABSTRACT

There is disclosed a circuit and method for converting on/off logic signals from one medium to on/off signals useful in a different medium. The circuit is particularly adapted to translate from negative voltage levels to positive voltage levels. The circuit includes voltage control levels for precisely controlling voltage as a function of temperature, all while only using positive voltage levels on the conversion circuit.

33 Claims, 3 Drawing Sheets

TRANSLATOR CIRCUIT AND METHOD OF OPERATION

TECHNICAL FIELD OF THE INVENTION

This invention relates to translator circuits and methods and more particularly to such circuits which convert from one on-off standard to a second on-off standard without introduction of unwanted voltages.

RELATED APPLICATIONS

All of the following patent applications are cross-referenced to one another, and all have been assigned to Texas Instruments Incorporated. These applications have been concurrently filed and are hereby incorporated in this patent application by reference.

BACKGROUND OF THE INVENTION

Electrical circuits today function in many modes. Two of these modes are the ECL mode and the CMOS mode. A single substrate or chip will have only one of these modes and when fast high density circuits are desired the CMOS mode will be used because of its lower power consumption. However, a complex circuit or system may be designed so that signals from one mode interfaces with circuitry constructed using the other mode. This presents a problem in that the ECL on-off (1-0) states are represented by negative 0.95 volts and negative 1.71 volts, respectively. The CMOS standard on-off (1-0) states, however, are plus 5 volts and 0 volts, respectively. Thus, one problem that is immediately clear is that the CMOS circuit does not require and usually does not have negative voltage available.

A converter circuit, then, is necessary for signals which must pass between ECL and CMOS in either direction. Because of the extremely high speeds which are now being demanded, any such conversion circuit must be extremely fast acting and must not introduce any errors into the circuitry. This later is particularly difficult to achieve when it is remembered that the nominal electrical characteristics of this type of electrical circuitry are subject to temperature variations. Sometimes, these variations are steep and because of the relative slight difference between the 1 and 0 voltage states, these variations can cause significant errors if not compensated for properly.

While there are some previous circuits that performed this type of function, typically they do not translate from voltage levels that are below ground to voltage levels above ground. In this regard, they take their ECL circuit and instead of running it from a negative supply which is typical for ECL circuits, they run it from a positive supply, thereby shifting their ECL levels up by 5 volts to create a pseudo ECL level. This is not available in some situations, and thus some circuits designed desire to keep the ECL voltage levels separate from the CMOS voltage levels.

Simply putting both a negative and a positive voltage supply on the BiCMOS chip would be relatively straightforward to do. However, there is a basic problem in that these high speed types of processes would be subject to breakdown problems if both a positive and a negative supply were on the same chip. This occurs since the voltage potential is greater than the junctions can withstand. Thus, CMOS circuits thrive much better in an environment with only positive 5 volts available, measured from ground (0 volts). At the same time it is important to have the true ECL negative voltage levels available for communicating back and forth between ECL and CMOS circuits.

Thus, there exists a need for a high speed ECL to CMOS conversion circuit built into a CMOS circuit which will accept the negative ECL signal levels and convert those levels to the standard positive signal levels recognized by the CMOS circuit all without introducing negative voltages onto the CMOS chip and all without sacrificing speed of operation so that speeds in the order of 0.5 nanosecond are possible.

There is a further need in the art for a CMOS circuit which functions from ECL logic levels without requiring negative voltage levels to be available within the CMOS circuit and which allows for internal testing of the CMOS circuit.

SUMMARY OF THE INVENTION

We have been able to achieve the use of true ECL negative voltage levels with only a positive supply on the CMOS chip by taking advantage of the negative 2 volt external termination circuit of all ECL circuits. This technique was used in a prior art circuit which, while it achieved its goal, was very slow. In order to solve the speed problem several major changes were made to the prior circuit. To begin with, the input control transistor is biased so that it is always turned on, thereby eliminating switching time. Next, an active device, as opposed to a resistor, is connected to the collector of the control transistor and acts as a load for the control transistor. Also, by using the active device, the resistive characteristics of the circuit actually change during switching thereby further speeding up the circuit operation. A transistor is used as a speed up capacitor to also speed up the circuit. Current mirrors are also used to enhance switching speed.

A very stable switching point is achieved by using controlled current to insure that the control transistor is stable over a variation of bias voltage. A threshold voltage reference level is provided which is temperature compensated and which controls the on-off detection.

It is thus a technical advantage of this invention to provide an ECL to CMOS converter circuit operating from positive voltages and capable of switching on/off states very rapidly without delay between operations.

It is still a further technical advantage of this invention to provide such a circuit which substitutes active devices for resistive loads, which uses an active device to mimic a capacitor, and uses current mirrors, all to further enhance the speed of operation.

It is still a further technical advantage of this invention to provide a circuit which provides on/off translation from one mode to another around a stable reference threshold so that the switching point does not change with fluctuations in the bias voltage of the circuit.

It is still a further technical advantage of this invention to provide such a translation circuit which can be bypassed for testing purposes without damage to the circuit and without the introduction of extraneous voltages into the core logic of the CMOS circuitry.

BRIEF DESCRIPTION OF THE DRAWINGS

The foregoing objects, features and technical advantages, as well as others, of the invention will be more apparent from the following description of the drawings in which.

DETAILED DESCRIPTION OF THE INVENTION

Figure 1:
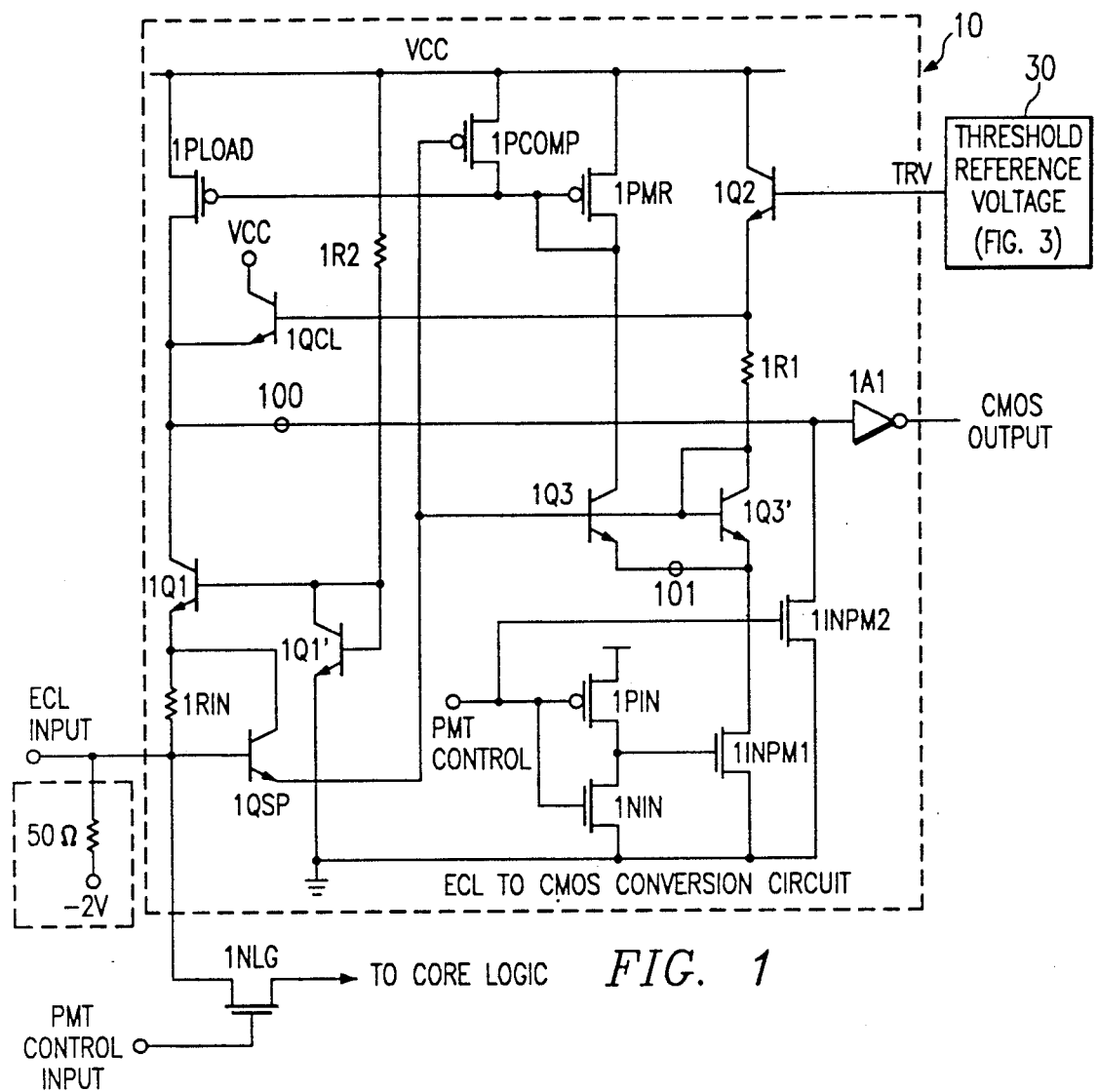
FIG. 1 shows a schematic diagram of the conversion circuit.

Turning now to FIG. 1, the signal from the ECL circuit (high to low or low to high) to the CMOS circuit is converted by circuit 10. The base of transistor 1QSP is tied to the ECL input and its emitter is tied to the base of bipolar transistors 1Q3 and 1Q3' essentially forming a capacitor between the input and the base of those bipolar transistors. The circuit operates such that when the input switches, a change in voltage occurs because of the capacitive coupling on the base of bipolar transistors 1Q3 and 1Q3' which, in turn, causes a large change in current to be pulled through those bipolar transistors. This in effect changes the voltage seen at the gate of P channel load transistor 1PLoad which makes the resistive characteristics of the P channel load change dramatically during switching.

Digressing momentarily, a P channel transistor, or any MOS transistor, has characteristics that when it is on, there is a small voltage between the source and drain, and it looks like a resistor. With slightly more voltage across the source and drain, the device behaves like a current source. The current level that can be maintained through such a device depends upon the voltage applied to its gate. Thus, changing the voltage on the gate changes the amount of current flowing through the transistor. So, for example, when we want node 100 at the collector of transistor 1Q1 to rise very quickly, we want to change the characteristics of the P channel load transistor 1PLoad such that it can supply a great deal more current to pull node 100 up during switching. Similarly, when we want node 100 to fall, to go into the negative direction, we want the characteristics of transistor 1PLoad to change so that it can supply less current, effectively appearing as a resistor so that node 100 will come low much more quickly. The use of this type of feedback path is important in making this circuit fast acting in both directions.

The feedback circuit consists of the bipolar transistor 1QSP with its base emitter capacitance feeding the base of bipolar transistor 1Q3 whose collector is tied to a P channel device 1PMR used for biasing the P channel load transistor 1PLoad.

Transistor 1PComp is a voltage compensation transistor. The reason for this transistor is that there is a mirror circuit consisting of P channel transistors 1PMR and 1PLoad. The purpose of the mirror circuit is that any current that is pulled through transistor 1PMR is mirrored in the current through transistor 1PLoad. However, problems exist because of the fact that these are not perfectly ideal devices and because of the fact that the power supply voltage VCC, which is nominally 5 volts, can vary from 5.5 volts down to 4.5 volts. Such a variation in voltage will cause a slight change in the current through transistor 1PLoad which is undesirable. Transistor 1PComp compensates for that effect. As the VCC voltage changes, the current being pulled through transistor 1PComp also changes, which has an effect on the voltage at the gate of transistor 1PLoad. By adjusting the sizes of these devices, we can cancel out the effect of the VCC supply variation. Thus, by proper sizing, the circuit will work so that the effects of any power supply variations are cancelled out.

Transistor 1PLoad is much bigger than transistor 1PComp. Transistor 1PComp does not draw a major amount of current in the circuit. However, it is enough to compensate for the slight changes in current caused by the changes in the VCC supply. The relative sizes are determined by computer modeling and simulation and are on the order of a 10 to 1 size between transistor 1PLoad and transistor 1PComp.

Transistor 1QCL is a bipolar transistor and is connected to node 100. Node 100, it will be recalled, goes low when the collector of transistor 1Q1 goes low. If this were to happen, transistor 1Q1 would saturate. However, node 100 is clamped to prevent the node from going so negative that transistor 1Q1 saturates. If transistor 1Q1 saturates, the performance of the circuit slows significantly.

The base of transistor 1QCL is tied to a voltage that is fixed by reference generator 30 so transistor 1QCL holds node 100 from going below a certain point, thereby preventing transistor 1Q1 from saturating. When node 100 comes high, transistor 1QCL is off and does not affect the circuit operation. The voltage at the emitter of transistor 1QCL is designed to come down to about ½ volt above ground. The base of transistor 1Q1 is set to be a VBE above ground. The base of transistor 1Q1 is tied to the collector and base of bipolar transistor 1Q1' and to resistor 1R2. Resistor 1R2 and transistor 1Q1' together set the voltage at the base of transistor 1Q1 to be one VBE above ground, which means that the emitter of transistor 1Q1 will be one VBE down from that point which will be at ground. Thus, the emitter of transistor 1Q1 is always at approximately ground with its base at one VBE above ground and its collector no more negative than about ½ volt above ground.

Threshold reference voltage 30 is needed because an input circuit must have a threshold at which the circuit switches. A voltage higher than the threshold will cause it to switch into one state, while a voltage lower than the threshold will cause it to switch into another state. As the input voltage varies, the voltage across resistor 1RIN also varies because the emitter of transistor 1Q1 is always at ground. Since one end of resistor 1RIN is always at ground, changing the voltage on the other end of the resistor (ECL input) changes the current through the resistor and this changes the current through transistor 1Q1.

The threshold point will be determined by the point at which the current through resistor 1R1N is enough to cause the voltage at the collector of transistor 1Q1 to change significantly which, in turn, depends upon the characteristics of transistor 1PLoad. The concept behind the threshold reference is that by controlling the voltage on the gate of transistor 1PLoad, we can control its characteristics and, therefore, control the threshold of the circuit. The current through transistor 1PLoad is mainly determined by the current through transistor 1PMR. The gate and drain of transistor 1PMR are tied to the collector of transistor 1Q3. That transistor's base is tied to the base and collector of transistor 1Q3'. The current through those two transistors is the same and is determined by the voltage across resistor 1R1. Since the emitters of transistors 1Q3 and 1Q3' are approximately at ground, these bases will be approximately one VBE above ground, or at about 0.75 volts. This value sets the voltage on one end of resistor 1R1. The voltage at the other end of resistor 1R1 is determined by the voltage at the emitter of transistor 1Q2, which, in turn, will be determined by the threshold reference voltage TRV. Thus, by changing the threshold reference voltage, the voltage across resistor 1R1 can be changed which changes the current through resistor 1R1, which, by means of the mirror circuit, sets the characteristics of transistor 1PLoad.

In this circuit, we also allow for something called parallel module test. What parallel module test does is to allow us to test a core function directly without coming through the conversion circuit. Since the core function is at CMOS levels, we must apply a CMOS voltage level to the input which is normally meant to receive an ECL level. In normal operation, applying a CMOS level to the ECL input could damage the circuit. However, enabling the PMT control load effectively shuts off certain devices in the circuit so that we can route the input signal directly to the CMOS circuitry.

The PMT control input goes to a P channel device 1PIN and to an N channel device 1NIN which is an invertor circuit. The output of that invertor feeds N channel transistor 1NPM1. Essentially, when we go into the parallel module test mode, we turn off N channel transistor 1NPM1 which allows the node 101 at the emitter of transistors 1Q3 and 1Q3' to float. This allows us to take the input all the way to CMOS levels without clamping them or damaging the circuit. Damage occurs because in normal operation, transistor 1NPM1 is on and represents a very small resistance so that the emitters of transistors of 1Q3 and 1Q3' are almost at ground. There are two base emitter junctions from the ECL input more to node 101 and this means the input cannot rise more than the voltage across two base emitter junctions. Typically, this would be about 1.5 volts. If the input is forced higher, extremely large currents would be pulled into the circuit, possibly causing damage. Turning off transistor 1NPM1 eliminates that problem.

In normal operation, N channel transistor 1NPM2 is off and does not affect the operation of the circuit. When the circuit is placed in the parallel module test mode, the output of this circuit would be floating and this could float to one state or the other which is undesirable for some of the tests that are performed. N channel transistor 1NPM2 is turned on when we are in the parallel module test mode and node 100 is pulled to ground. Accordingly, the output of the conversion circuit, via amplifier 1A1 is forced high during the test mode.

During parallel module test (PMT) we are not using the translator, but rather going around it. However, the output of the translator still does feed core logic, which if fed by a level that was floating, could cause the core CMOS logic to dissipate DC power when it should not be dissipating power.

For PMT control, transistor 1NLG is turned on, the idea being that when the PMT control input signal goes high, transistor 1NLG turns on and allows a signal from the ECL pin to go directly into the CMOS core for testing core functions.

Figure 2:
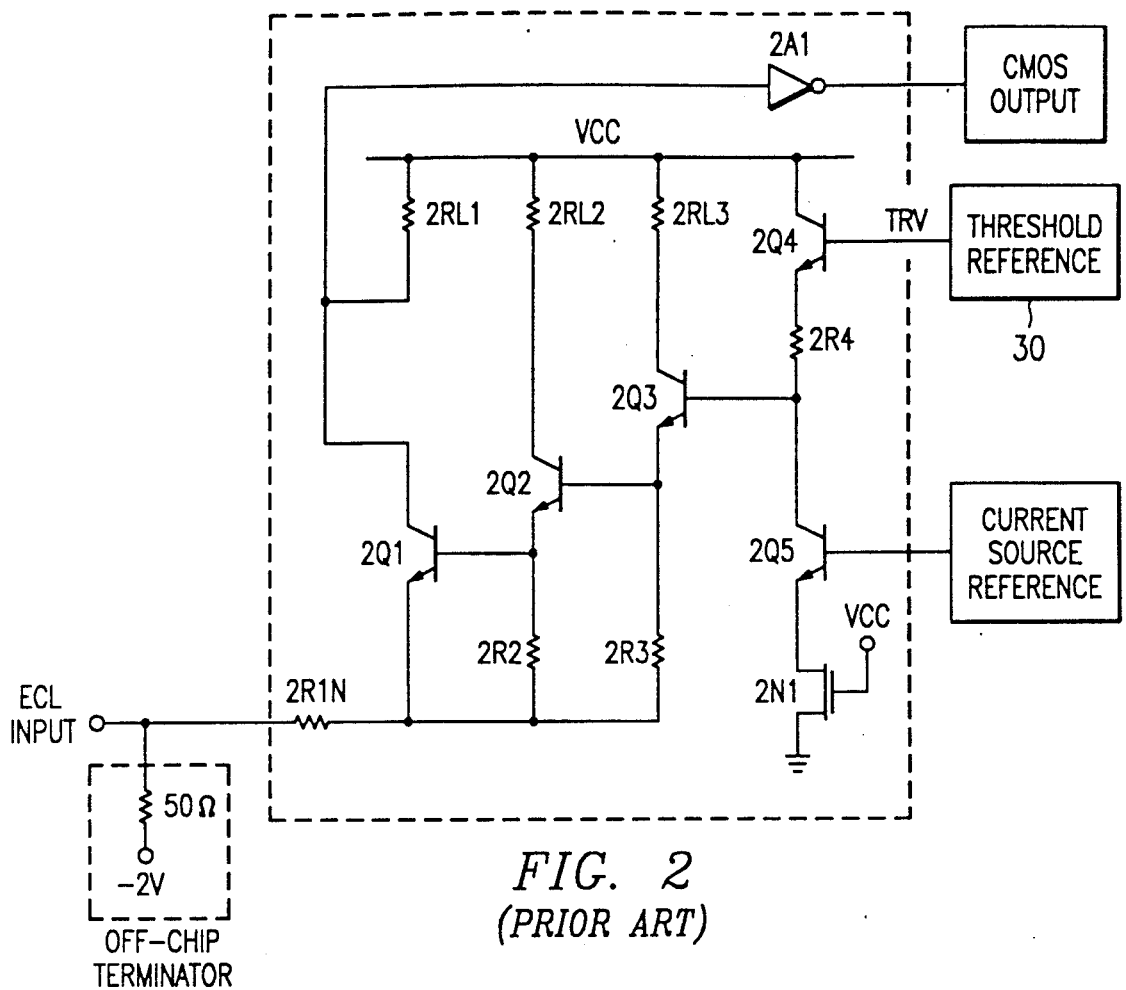
FIG. 2 shows a prior art version of the conversion circuit.

In order to solve the speed problem, several major changes were made to the prior art circuit, as shown in FIG. 2. To begin with, in the improved circuit the control transistor (1Q1) is biased so that it is always turned on, which eliminate switching time. Next, a P channel transistor (1PLoad) is connected to the collector of the control transistor (1Q1) and acts as a load for the control transistor. In the prior art circuit of FIG. 2, transistor 2Q1 actually switches on and off.

Another major improvement is that transistor 1Q1 (FIG. 1) is connected to a P channel transistor used as a load to achieve a characteristic such that the switching point at the collector transistor of 1Q1 switches much more quickly and suddenly than if just a resistor were used. Also, by using the P channel load transistor, we can employ a path back through the circuit where the resistive characteristics of that P channel transistor actually change during switching, further speeding up the circuit. This is accomplished by the use of the transistor acting as a speed up capacitor.

The circuit of FIG. 1 uses current mirrors to further speed up the switching of the P channel transistor. A voltage regulator is used to maintain a very stable switching point for the P channel device. A current drain is also used to insure that the control transistor is stable over a variation of voltage. A threshold voltage reference level is provided which is temperature compensated and which controls the on-off detection.

Threshold Reference Voltage

Figure 3:
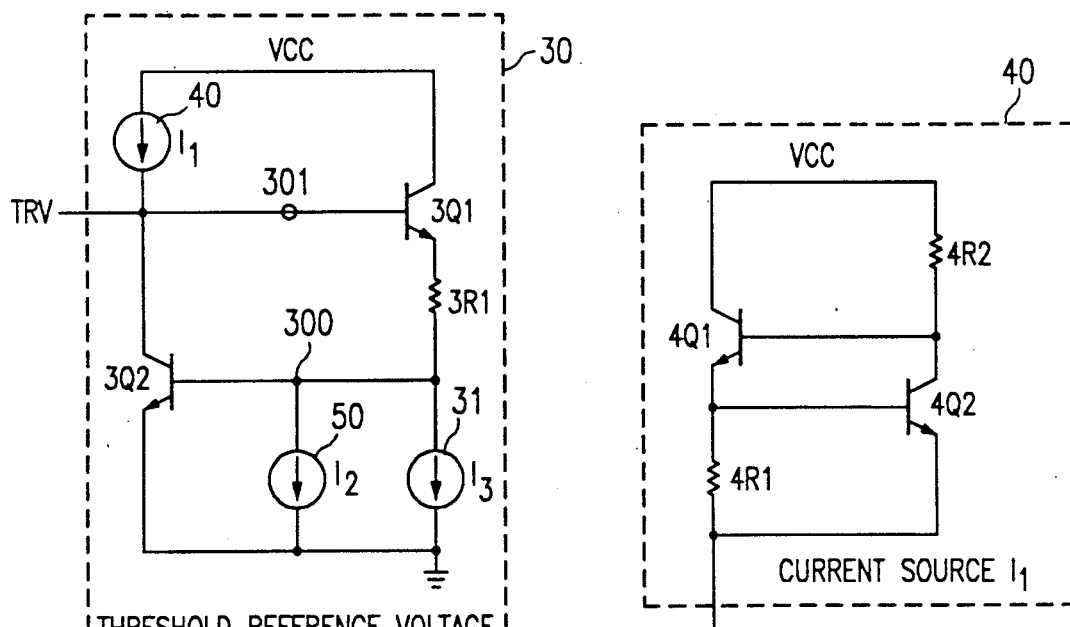
FIG. 3 shows a schematic representation of the reference voltage circuit.

Threshold reference voltage circuit 30 is shown in FIG. 3. The voltage reference TRV is a certain voltage up from ground. There is a base to emitter voltage (VBE) across transistor 3Q2 so the base of 3Q2 is a VBE up from ground. There will be some voltage across resistors 3R1 and there is another VBE across transistor 3Q1 and that voltage is the reference voltage TRV. Essentially then, reference voltage TRV is up two VBE's plus the voltage across resistor 3R1 from ground. In order to have the VBE across transistor 3Q2 remain constant and independent of voltage, a current source 40 is used to provide a current I1 into transistor 3Q2.

The VBE's of this circuit have certain temperature characteristics that are dependent upon the technology, and cannot easily be adjusted. However, it is critical to adjust the voltage across resistor 3R1 over temperature in order to obtain the temperature coefficient desired. This temperature coefficient, as we will see, is different for different types of circuits. The voltage across resistor 3R1 is, of course, set by the current being pulled through it. This current, in turn, is set by two different current sources 50 (I2) and 31 (I3). These sources have been constructed differently so that the current through one of the current sources will increase as temperature increases, while the current through the other current source will decrease as temperature increases. Then, by changing the magnitudes of I2 and I3 relative to each other, it is possible to obtain the exact characteristic of voltage change across resistor 3R1 with temperature desired.

Figure 4:
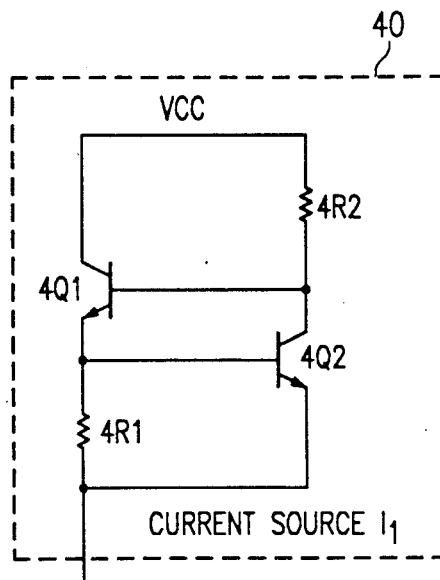
FIG. 4 shows one embodiment of one of the current sources.

FIG. 4 shows one embodiment of current source 40 (I1) which is basically a current source that must be independent of supply voltage VCC. This source is constructed using two bipolar transistors 4Q1 and 4Q2 and two resistors 4R1 and 4R2. Most of the current in circuit 40 flows through transistor 4Q1 and resistor 4R1. Only a small percentage of current flows through resistor 4R2 and transistor 4Q2. Resistor 4R2 is large with respect to resistor 4R1. The base emitter voltage across transistor 4Q2 sets the voltage across resistor 4R1, and therefore, sets the current dependent on the value of resistor 4R1.

As the voltage VCC applied to the circuit changes, the VBE of transistor 4Q2 does not change and thus the voltage across resistor 4R1 does not change. Accordingly, the current through resistor 4R1 which is also the current through resistor 4Q1 remains constant and independent of voltage supply. As the supply voltage VCC varies, the voltage across the resistor 4R2 will vary and thus the current through that resistor will vary. However, because resistor 4R2 is large and represents only a small percentage of the total current, circuit 40 (I1) comes very close to being independent of voltage.

Figure 5:
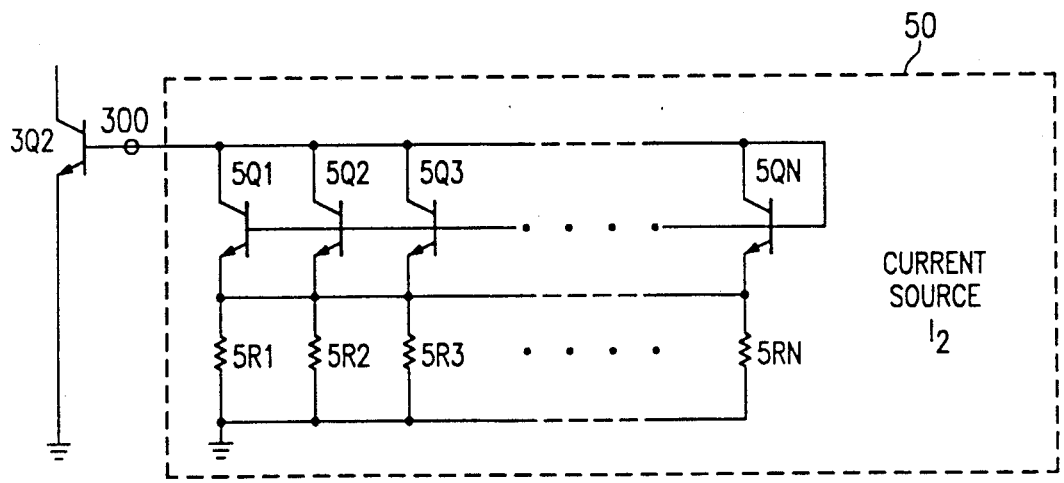
FIG. 5 shows an embodiment of a second one of the current sources.

FIG. 5 shows one embodiment of current source 50 (I2) which is connected between the base and emitter of transistor 3Q2 (FIG. 3). Current source 50 is established so that its current will increase as temperature increases. This is accomplished by taking advantage of the properties of bipolar transistors which are very stable and very predictable and operate such that the voltage across their base emitter junctions decreases as temperature increases. The rate of decrease is dependent on the current density in these transistors such that as the current density decreases, the rate at which the voltage decreases grows larger. Thus, for example, when the voltage across the base to emitter of transistor 3Q2 decreases as the temperature increases, the VBE voltage of all the bipolar transistors 5Q1 to 5QN in current source 50 also decreases. However, this circuit is set up so that the bipolar transistors in current source 50 have a much lower current density than the current flowing through transistor 3Q2.

Digressing momentarily, this can be accomplished in several ways. One method is by putting many transistors in parallel and making very large transistors. We tend to put many transistors in parallel so that all the transistors in the circuit can be exactly the same so that variations in layout and processing will affect them all in the exact same way.

Because the VBE's of the transistors in circuit 50 are shrinking more rapidly than the VBE of transistor 3Q2, it means that the total voltage across resistors 5R1 to 5RN in current source 50 increases as temperature increases. Since the voltage across these resistors increase, the current through them increases. Thus, with increasing temperature, current source 50 pulls more current.

Since the total voltage across current source 50 is basically the sum of the voltage across the base emitters of transistors 5Q1 to 5QN plus the voltage across resistors 5R1 to 5RN, it follows that the voltage across resistors 5R1 to 5RN must increase.

Figure 6:
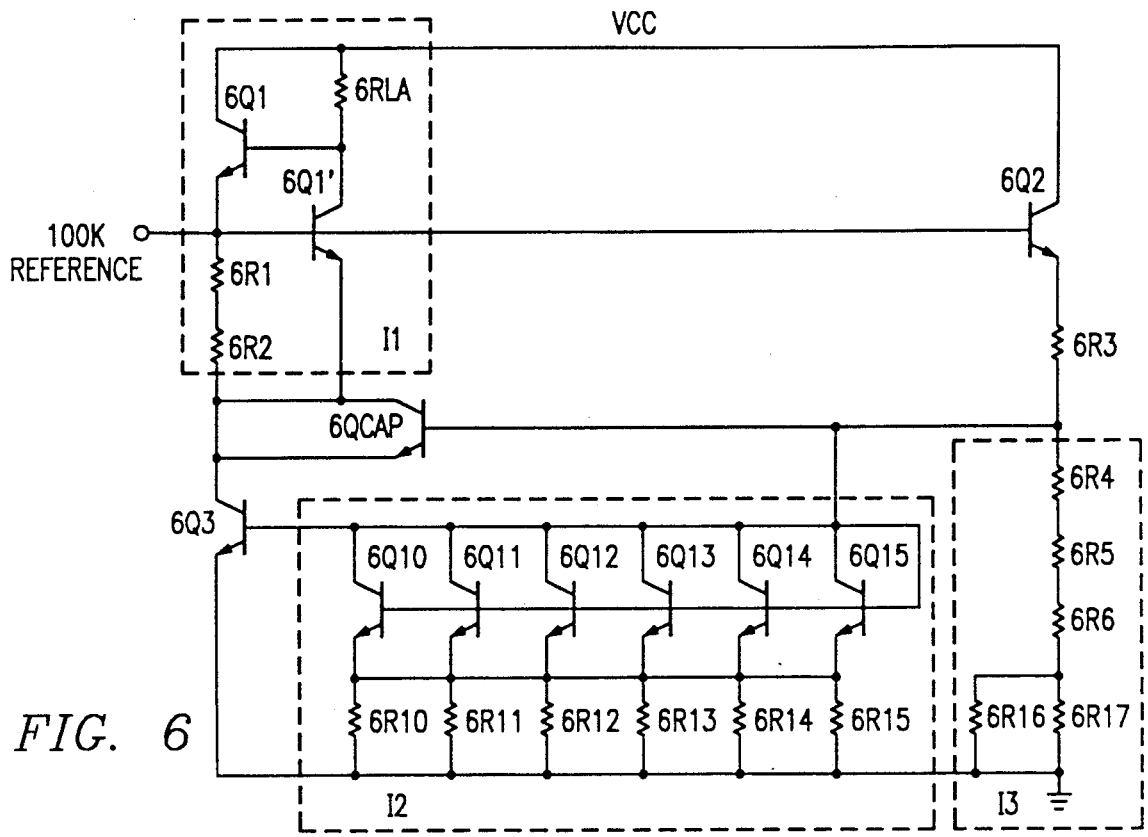
FIGS. 6 and 7 show embodiments of the special voltage circuit using different temperature/voltage coefficients.

Current source 31 (I3) is shown detailed in FIG. 6 and is very simply implemented as a resistor or series of resistors. This follows since the property of I3 is such that it should decrease as temperature increases. The voltage across circuit 31 is the voltage across the base emitter junction of transistor 3Q2, which is transistor 6Q3, in FIG. 6. That voltage will decrease with increasing temperature so if circuit 31 is a resistor, its current will decrease with increasing temperature.

By changing the magnitudes of I2 and I3, we can adjust the total amount of current to increase or decrease in any amounts we wish over temperature. These values can be changed remotely by adding appropriate transistor switches and access to control the switches, either on a permanent basis, as with toggle switches, or as with leads allowing remote programming.

Figure 7:
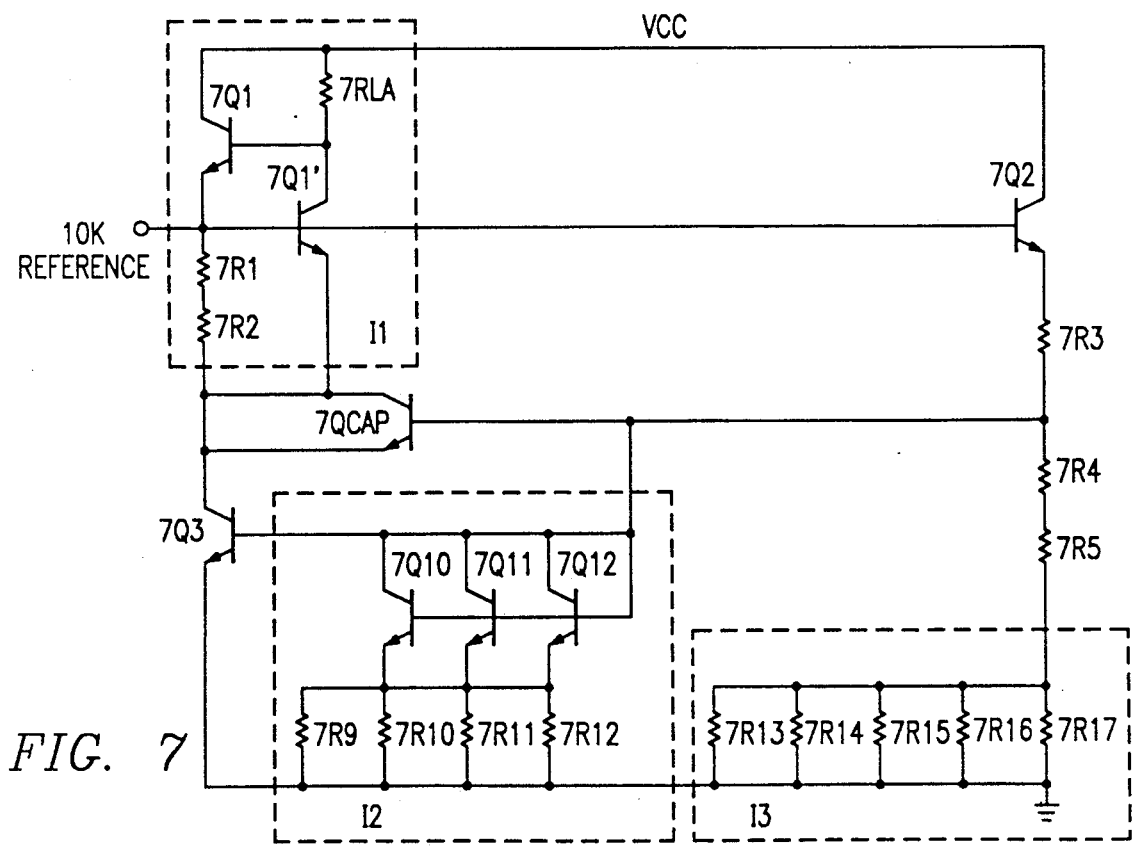

Specific examples are shown in FIGS. 6 and 7. For example, in the 100K bias generator shown in FIG. 6, the current source I2 consists of six bipolar transistors 6Q10-6Q15 and six resistors 6R10-6R15 in parallel. The I3 current source consists of two resistors 6R16-6R17 in parallel and in series with three resistors 6R4-6R6. Now the reason we use parallel series combinations of resistors and transistors is that when we lay them out, they are all identical. Thus, if the process varies, the ratios of resistances don't vary.

The 10KH reference circuit shown in FIG. 7 is set up with the same concept. It is set up so that the amount of current going through the I2 and I3 current sources has changed. In the 10KH reference, the I3 current source has less resistance so that it pulls more current. The I2 current source is pulling less current, which changes the temperature characteristic of the total current being pulled through the sum of I2 and I3, and that is what gives us the desired temperature characteristics at the output of the reference generators.

It turns out that in the case of the 100K generator (FIG. 6) the voltage across resistor 6R3 must be constant with temperature. That means reference voltage output will decrease with increasing temperature at the rate at which 2 VBE's decrease with temperature. These two VBE's decreasing with temperature are to compensate for two other VBE's in the actual ECL to CMOS translator (FIG. 1) which decrease with temperature. It turns out that keeping the voltage constant across 6R3 over temperature will enable translator 10 to maintain a constant threshold.

The 10KH reference must change with temperature so the voltage across 7R3 must change with temperature. Thus, in the case of the 100K circuit (FIG. 6) we are maintaining a constant voltage across resistor 6R3 over temperature while in the case of 10KH circuits in FIG. 7 we are not. So for the 100K case, the sum of I2 and I3 must give a current that is constant over temperature. In the 10KH case, that is not the case so we adjust the relative ratios of current being pulled through I2 and I3 so that the voltage across R1 does in fact change over temperature.

Although the present invention has been described with respect to a specific preferred embodiment thereof, various changes and modifications may be suggested by one skilled in the art, and it is intended that the present invention encompass such changes and modifications as fall within the scope of the appended claims.

Note that an extra transistor, 6QCAP (FIG. 6), or 7QCAP (FIG. 7) has been added to the generators. The generators have a feedback path which helps provide a low impedance output, but the feedback path can also cause the circuit to oscillate. The base-emitter, base-collector, and collector-substrate capacitances of 6QCAP or 7QCAP change the gain and phase shift characteristics of the generators so that they cannot oscillate. The use of device capacitances such as provided by 6QCAP or 7QCAP to prevent oscillations is a common, well-known practice used on circuits having feedback paths.

What is claimed is:

1. A circuit for converting from first logic on/off input levels to second logic output levels, said circuit including only positive voltages with respect to ground, said circuit comprising:

a threshold reference voltage measured positive with respect to ground, said reference voltage used to set the level for switching between said on and off levels;

an output node for driving said on/off output levels;

a control switch biased continuously in the conducting condition, said switch operable for providing high and low current to said output node; and circuitry for quickly changing said control switch between said high and low current conditions dependent upon whether or not the voltage condition presented to said circuit input is above or below said reference voltage where above represents the logical on condition and below represents the logical off condition of an input signal.

2. The circuit set forth in claim 1 wherein said quickly changing circuitry includes:

a load control switch operable for controlling said control switch; and wherein the threshold between said on and off condition of said input signal is controlled by said value of said threshold reference voltage and the switching point of said load control switch.

3. The circuit set forth in claim 2 wherein said load control switch is a gated transistor and wherein said threshold voltage is applied to the gate of said transistor via a current mirror circuit.

4. The circuit set forth in claim 3 wherein said circuitry further comprises:

a pair of transistors connected base to base and emitter to emitter, said base coupled to said input such that a change in input signal causes a large change in current at the collector of a first one of said transistors; and circuitry for connecting said load control switch to said transistor pair and to said threshold voltage such that said load control switch operates under control of said current change from said first transistor for quickly changing from one state to the other.

5. The circuit set forth in claim 4 further comprising:

a voltage compensation circuit for removing the effects of voltage variations in said positive supply voltage so as to maintain constant the current flowing through said load control switch, said compensation circuit including a transistor connected from said supply voltage to the gate of said load transistor.

6. The circuit set forth in claim 5 wherein said compensation transistor is sized with respect to said load transistor.

7. The circuit set forth in claim 6 wherein said size ratio is 10 to 1 between said load transistor and said compensation transistor.

8. The circuit set forth in claim 4 wherein said control switch is a transistor, which transistor is prevented from saturating by a transistor connected between said supply voltage and said output node.

9. The circuit set forth in claim 8 further comprising circuitry for maintaining the base of said control transistor one VBE above ground, thereby forcing the emitter of said transistor to be at approximately ground potential so as to allow a current flow through said control transistor dependant upon the voltage change at said circuit input.

10. The circuit set forth in claim 4 wherein said threshold voltage controls the current in a second one of said pair of transistors, thereby changing the current flowing through said first one of said transistors of said pair, which current is communicated to said load transistor via said current mirror.

11. The circuit set forth in claim 2 further comprising:

circuitry for establishing a specific voltage level at said circuit output without regard to said input signal; and circuitry for allowing said input signal to bypass said circuit and be presented directly to said CMOS circuit.

12. A circuit for converting from ECL logic on/off input levels to CMOS logic output levels, said circuit including only positive voltages with respect to ground, said circuit comprising:

a threshold reference voltage measured positive with respect to ground, said reference voltage used to set the level for switching between said on and off levels;

a control transistor switch biased continuously in the conducting condition, the emitter of said transistor resistively connected to the input of said circuit;

an output control node for driving the on/off output levels, said output node connected to the collector of said control transistor; and circuitry for quickly changing said control node from high to low dependent upon whether or not the voltage condition presented to said circuit input is above or below said reference voltage.

13. The circuit set forth in claim 12 wherein said circuitry comprises:

a pair of transistors connected base to base and emitter to emitter, said base coupled to said input such that a change in input signal causes a large change in current at the collector of a first one of said transistors;

a load transistor connected to the collector of said control transistor and to said output node, said load transistor acting as a resistive path for said control transistor while in one state and acting as a high current source for said control transistor in a second state, said load transistor operable under control of said current change from said first transistor for quickly changing from one state to the other.

14. The circuit set forth in claim 13 further comprising:

a current mirror consisting of a pair of transistors, one of which is said load transistor; and wherein said current change from said first transistor is communicated to said load transistor via the other transistor of said current mirror.

15. The circuit set forth in claim 14 further comprising:

a voltage compensation circuit for removing the effects of voltage variations in said positive supply voltage so as to maintain constant the current flowing through said load transistor, said compensation circuit including a transistor connected from said supply voltage to the gate of said load transistor.

16. The circuit set forth in claim 15 wherein said compensation transistor is sized with respect to said load transistor.

17. The circuit set forth in claim 16 wherein said size ratio is 10 to 1 between said load transistor and said compensation transistor.

18. The circuit set forth in claim 14 wherein said control transistor is prevented from saturating by a transistor connected between said supply voltage and said output node.

19. The circuit set forth in claim 14 further comprising circuitry for maintaining the base of said control transistor one VBE above ground, thereby forcing the emitter of said transistor to be at approximately ground potential so as to allow a current flow through said control transistor dependant upon the voltage change at said circuit input.

20. The circuit set forth in claim 19 wherein the threshold between said on and off condition of said input signal is controlled by said value of said threshold reference voltage and the switching point of said load transistor.

21. The circuit set forth in claim 20 wherein said threshold voltage controls the current in a second one of said pair of transistors, thereby changing the current flowing through said first one of said transistors of said pair, which current is communicated to said load transistor via said current mirror.

22. The circuit set forth in claim 13 further comprising:
circuitry for establishing a specific voltage level at said circuit output without regard to said input signal; and
circuitry for allowing said input signal to bypass said circuit and be presented directly to said CMOS circuit.

23. The method of converting from first logic on/off input levels to second logic output levels while using only positive voltages with respect to ground, said method comprising the steps of:
establishing a threshold reference voltage measured positive with respect to ground, said reference voltage used to set the level for switching between said on and off levels;
driving said on/off output levels from an output node;
biasing a control switch so that it is continuously in the conducting condition, said switch operable for providing high and low current to said output node; and
quickly changing said control switch between said high and low current conditions dependent upon whether or not the voltage condition presented to said circuit input is above or below said established reference voltage, wherein above represents the logical on condition and below represents the logical off condition of an input signal.

24. The method set forth in claim 23 wherein said quickly changing step includes:
controlling said control switch from a load control switch; and
wherein the threshold between said on and off condition of said input signal is controlled by said value of said threshold reference voltage and the switching point of said load control switch.

25. The method set forth in claim 24 wherein said load control switch is a gated transistor and wherein said method further includes the step of:
applying said threshold voltage to the gate of said transistor via a current mirror circuit.

26. The method set forth in claim 25 wherein said circuitry further comprises:
a pair of transistors connected base to base and emitter to emitter, said base coupled to said input such that a change in input signal causes a large change in current at the collector of a first one of said transistors, and wherein said method further includes the step of:
connecting said load control switch to said transistor pair and to said threshold voltage such that said load control switch operates under control of said current change from said first transistor for quickly changing from one state to the other.

27. The method set forth in claim 26 further comprising the step of:
removing the effects of voltage variations in said positive supply voltage so as to maintain constant the current flowing through said load control switch, said step including connecting a compensation transistor from said supply voltage to the gate of said load transistor.

28. The method set forth in claim 27 wherein said connected compensation transistor is sized with respect to said load transistor.

29. The method set forth in claim 28 wherein said size ratio is 10 to 1 between said load transistor and said compensation transistor.

30. The method set forth in claim 26 wherein said control switch is a transistor, and wherein said method includes the step of: preventing said transistor from saturating by a transistor connected between said supply voltage and said output node.

31. The method set forth in claim 24 further comprising the steps of:
establishing a specific voltage level at said circuit output without regard to said input signal; and
allowing said input signal to bypass said circuit.

32. The method of converting from ECL logic on/off input levels to CMOS logic output levels, said method including the steps of:
establishing a threshold reference voltage measured positive with respect to ground, said reference voltage used to set the level for switching between said on and off levels;
continuously biasing a control transistor switch in the conducting condition, the emitter of said transistor resistively connected to the input of said circuit;
driving the on/off output levels from an output control node, said output node connected to the collector of said control transistor; and
quickly changing said control node from high to low dependent upon whether or not the voltage condition presented to said circuit input is above or below said reference voltage.

33. The method set forth in claim 32 wherein there is a pair of transistors connected base to base and emitter to emitter, said base coupled to said input such that a change in input signal causes a large change in current at the collector of a first one of said transistors; and
a load transistor connected to the collector of said control transistor and to said output node, said load transistor acting as a resistive path for said control transistor while in one state and acting as a high current source for said control transistor in a second state, and wherein said method includes the step of:
operating said load transistor operable under control of said current change from said first transistor for quickly changing from on state to the other.

* * * * *

REEXAMINATION CERTIFICATE (1906th)
United States Patent [19]
Bass et al.

[11] B1 5,027,014
[45] Certificate Issued Jan. 19, 1993

[54] TRANSLATOR CIRCUIT AND METHOD OF OPERATION

[75] Inventors: Alan S. Bass, Plano; Stephen R. Schenck, McKinney; Robert C. Martin, Dallas, all of Tex.

[73] Assignee: Texas Instruments Incorporated, Dallas, Tex.

Reexamination Request:
No. 90/002,588, Feb. 12, 1992

Reexamination Certificate for:
Patent No.: 5,027,014
Issued: Jun. 25, 1991
Appl. No.: 502,471
Filed: Mar. 30, 1990

[51] Int. Cl.$^5$ .............. H03K 19/092; H03K 19/094; H03K 19/086; H03K 19/003
[52] U.S. Cl. ............................. 307/475; 307/270; 307/443; 307/446; 307/451; 307/310; 323/315
[58] Field of Search .......... 307/443, 446, 451, 455, 307/475, 310, 448

[56] References Cited
U.S. PATENT DOCUMENTS

| | | | |
|---|---|---|---|
| 4,396,883 | 8/1983 | Holloway et al. | 323/313 |
| 4,472,675 | 9/1984 | Shinomiya | 323/314 |
| 4,658,205 | 4/1987 | Yamada | 323/313 |
| 4,785,205 | 11/1988 | Sanwo et al. | 307/475 |
| 4,891,535 | 1/1990 | Etheridge | 307/475 |
| 5,036,226 | 7/1991 | Tonnu et al. | 307/475 |
| 5,043,605 | 8/1991 | Gabara | 307/475 |

FOREIGN PATENT DOCUMENTS 0140-677A3  5/1985  European Pat. Off.
58-80716  5/1983  Japan.

*Primary Examiner*—D. R. Hudspeth

[57] ABSTRACT

There is disclosed a circuit and method for converting on/off logic signals from one medium to on/off signals useful in a different medium. The circuit is particularly adapted to translate from negative voltage levels to positive voltage levels. The circuit includes voltage control levels for precisely controlling voltage as a function of temperature, all while only using positive voltage levels on the conversion circuit.

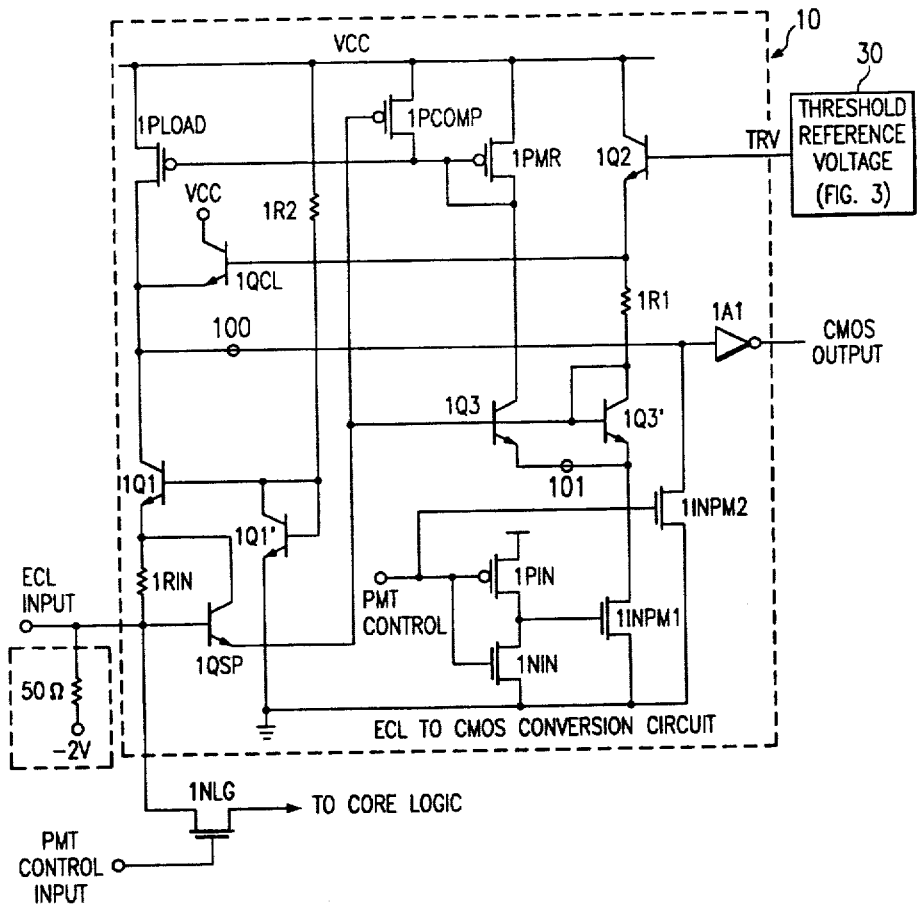

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-33 are determined to be patentable as amended.

1. A circuit for converting from first logic [on/off] *on and off* input levels to second logic *on and off* output levels, said *converter* circuit including only positive *supply* voltages with respect to ground, said *converter* circuit comprising:

a threshold reference voltage *circuit for providing a threshold reference voltage* measured positive with respect to ground, said *threshold* reference voltage used to set [the] *a threshold input* level for switching *the output* between said *logic* on and off levels *when the logic input level crosses said threshold input level;* an output node for [driving] *providing* said [on/off] *providing* said [on/off] *logic on and off* output levels;

a control [switch] *transistor* biased continuously in the conducting condition, said [switch] *control transistor* operable for providing high and low current to said output node; and circuitry for [quickly] changing said control [switch] *transistor* between said high and low current conditions dependent upon whether [or not] the [voltage condition] *logic input level* presented to [said] *the input of the converting* circuit [input] is above or below said [reference voltage where] *threshold input switching level wherein* above represents the logical on condition and below represents the logical off condition of an input signal.

2. The *converter* circuit set forth in claim 1 wherein said [quickly] changing circuitry includes:

a load control [switch] *transistor* operable for controlling said control [switch] *transistor*; and wherein the threshold *input switching level* between said on and off condition of said input signal is controlled by [said] *a* value of said threshold reference voltage and [the] *a* switching point of said load control [switch] *transistor*.

3. The *converter* circuit set forth in claim 2 wherein said load control [switch] *transistor* is a gated transistor and wherein said threshold *reference* voltage is applied to the gate of said *load control* transistor via a current mirror circuit.

4. The *converter* circuit set forth in claim 3 wherein said *converter* circuitry further comprises:

a pair of transistors connected base to base and emitter to emitter, said base coupled to [said] *the* input *of said converter circuit* such that a change in input signal causes a large change in current at [the] *a* collector of a first one of said transistors; and circuitry for connecting said load control [switch] *transistor* to said transistor pair and to said threshold *reference* voltage *circuit* such that said load control [switch] *transistor* operates under control of said current change from said first transistor for quickly changing *the output logic level* from one state to the other.

5. The *converter* circuit set forth in claim 4 further comprising:

a voltage compensation circuit for removing the effects of voltage variations in said positive supply voltage so as to maintain constant the current flowing through said load control [switch] *transistor*, said *voltage* compensation circuit including a transistor connected from said supply voltage to the gate of said load *control* transistor.

6. A *converter* circuit set forth in claim 5 wherein said *voltage* compensation *circuit* transistor is sized with respect to said load *control* transistor.

7. The *converter* circuit set forth in claim 6 wherein said size ratio is 10 to 1 between said load *control* transistor and said *voltage* compensation *circuit* transistor.

8. The *converter* circuit set forth in claim 4 wherein [said control switch is a transistor, which] *the control* transistor is prevented from saturating by a transistor connected between said supply voltage and said output node.

9. The *converter* circuit set forth in claim 8 further comprising circuitry for maintaining the base of said control transistor one VBE above ground, thereby forcing the emitter of said *control* transistor to be at approximately ground potential so as to allow a current flow through said control transistor dependant upon the [voltage change] *signal level* at said *converter* circuit input.

10. The *converter* circuit set forth in claim 4 wherein said threshold *reference* voltage controls the current in a second one of said pair of transistors, thereby changing the current flowing through said first one of said transistors of said pair, which current is communicated to said load control transistor via said current mirror *circuit*.

11. The *converter* circuit set forth in claim 2 further comprising:

circuitry for establishing a specific voltage level at said circuit output without regard to said input signal; and circuitry for allowing said input signal to bypass said *converter* circuit and be presented directly to [said] *a* CMOS circuit.

12. A circuit for converting from ECL logic [on/off] *on and off* input levels to CMOS logic *on and off* output levels, said *converter* circuit [including] *having* only positive *supply* voltages with respect to ground, said *converter* circuit comprising:

a threshold reference voltage *circuit for providing a threshold reference voltage* measured positive with respect to ground, said *threshold* reference voltage used to set [the] *a threshold input* level for switching *the output* between said on and off levels *when the logic input level crosses said threshold input level;* a control transistor [switch] biased continuously in the conducting condition, [the] *an* emitter of said *control* transistor resistively connected to [the] *an* input of said *converter* circuit;

an output [control] node for [driving] *providing* the [on/off] *logic on and off* output levels, said output node connected to [the] *a* collector of said control transistor; and circuitry for [quickly] changing said [control] *output* node from high to low *current condition* dependent upon whether [or not] the [voltage condition] *input level* presented to said *converter* circuit input is above or below said [reference voltage] *threshold input level for switching.*

13. The *converter* circuit set forth in claim 12 wherein said circuitry comprises:
 a pair of transistors connected base to base and emitter to emitter, said base coupled to [said] *the* input *of said converter circuit* such that a change in input signal causes a large change in current at [the] *a* collector of a first one of said transistors;
 a load transistor connected to the collector of said control transistor and to said output node, said load transistor acting as a resistive path for said control transistor while in one state and acting as a high current source for said control transistor in a second state, said load transistor operable under control of said current change from said first transistor for quickly changing from one state to the other.

14. The *converter* circuit set forth in claim 13 further comprising:
 a current mirror consisting of a *second* pair of transistors, one of which is said load transistor, and
 wherein said current change from said first transistor is communicated to said load transistor via the other transistor of said current mirror.

15. The *converter* circuit set forth in claim 14 further comprising:
 a voltage compensation circuit for removing the effects of voltage variations in said positive supply voltage so as to maintain constant the current flowing through said load transistor, said *voltage* compensation circuit including a transistor connected from said supply voltage to the gate of said load transistor.

16. The *converter* circuit set forth in claim 15 wherein said *voltage* compensation transistor is sized with respect to said load transistor.

17. The *converter* circuit set forth in claim 16 wherein said size ratio is 10 to 1 between said load transistor and said *voltage* compensation transistor.

18. The *converter* circuit set forth in claim 14 wherein said control transistor is prevented from saturating by a transistor connected between said supply voltage and said output node.

19. The *converter* circuit set forth in claim 14 further comprising circuitry for maintaining the base of said control transistor one VBE above ground, thereby forcing the emitter of said *control* transistor to be at approximately ground potential so as to allow a current flow through said control transistor dependant upon the voltage change at said *converter* circuit input.

20. The *converter* circuit set forth in claim 19 wherein the threshold *for switching* between said on and off [condition] *level* of said input signal is controlled by [said value of] said threshold reference voltage and [the] *a* switching point of said load transistor.

21. The *converter* circuit set forth in claim 20 wherein said threshold *reference* voltage controls the current in a second one of said pair of transistors, thereby changing the current flowing through said first one of said transistors of said pair, which current is communicated to said load transistor via said current mirror.

22. The *converter* circuit set forth in claim 13 further comprising:
 circuitry for establishing a specific voltage level at said circuit output [without regard to said] *which is not effected by an* input signal; and
 circuitry for allowing said input signal to bypass said circuit and be presented directly to [said] *a* CMOS circuit.

23. The method of converting from first logic [on/off] *on and off* input levels to second logic *on and off* output levels while using only positive *supply* voltages with respect to ground, said method comprising the steps of:
 establishing a threshold reference voltage measured positive with respect to ground, said reference voltage used to set [the] *a threshold input* level for switching *the output* between said on and off levels *when the logic input level crosses said threshold input level; driving said* [on/off] *on and off* output levels from an output node;
 biasing a control [switch] *transistor* so that it is continuously in [the] *a* conducting condition, said [switch] *transistor* operable for providing high and low current to said output node; and
 [quickly] changing said control [switch] *transistor* between said high and low current conditions dependent upon whether [or not] the [voltage condition] *level* presented to said circuit input is above or below said [established reference voltage] *level for switching,* wherein above represents the logical on condition and below represents the logical off condition of an input signal.

24. The method set forth in claim 23 wherein said [quickly] changing step includes:
 controlling said control [switch] *transistor* from a load control [switch] *transistor;* and
 wherein the threshold *level for switching* between said on and off [condition] *logic level* of said input signal is controlled by [said value of] said threshold reference voltage and [the] *a* switching point of said load control [switch] *transistor.*

25. The method set forth in claim 24 wherein said load control [switch] *transistor* is a gated transistor and wherein said method further includes the step of:
 applying said threshold *reference* voltage to the gate of said *gated* transistor via a current mirror circuit.

26. The method set forth in claim 25 wherein said *converter* circuitry further comprises:
 a pair of transistors connected base to base and emitter to emitter, said base coupled to [said] *an* input *of said converter cirtcuit* such that a change in input signal *level* causes a large change in current at [the] *a* collector of a first one of said transistors, and wherein said method further includes the step of:
 connecting said load control [switch] *transistor* to said transistor pair and to said threshold *reference* voltage such that said load control [switch] *transistor* operates under control of said current change from said first transistor for quickly changing from one state to the other.

27. The method set forth in claim 26 further comprising the step of:
 removing the effects of voltage variations in said positive supply voltage so as to maintain constant the current flowing through said load control [switch] *transistor,* said step including connecting a compensation transistor from said supply voltage to the gate of said load *control* transistor.

28. The method set forth in claim 27 wherein said connected compensation transistor is sized with respect to said load *control* transistor.

29. The method set forth in claim 28 wherein said size ratio is 10 to 1 between said load *control* transistor and said compensation transistor.

30. The method set forth in claim 26 [wherein said control switch is a transistor, and] wherein said method includes the step of: preventing said *control* transistor from saturating by a transistor connected between said supply voltage and said output node.

31. The method set forth in claim 24 further comprising the steps of:
   establishing a specific voltage level at said *converter* circuit output [without regard to] *which is not effected by* said input signal; and
   allowing said input signal to bypass said *converter* circuit.

32. The method of converting from ECL logic [on/-off] *on and off* input levels to CMOS logic *on and off* output levels, said method including the steps of:
   establishing a threshold reference voltage measured positive with respect to ground, said *threshold* reference voltage used to set [the] *a threshold input* level for switching *the output* between said *logic* on and off levels *when the logic input level crosses said threshold input level for switching;*
   continuously biasing a control transistor [switch] in the conducting condition, the emitter of said control transistor resistively connected to the input of [said] *a converter* circuit;
   driving the [on/off] *on and off* output levels from an output control node, said output node connected to [the] *a* collector of said control transistor; and
   [quickly] changing said control node from high to low dependent upon whether [or not] the voltage [condition] *level* presented to said circuit input is above or below said [reference voltage] *threshold level for switching.*

33. The method set forth in claim 32 wherein there is a pair of transistors connected base to base and emitter to emitter, said base coupled to said input such that a change in input signal causes a large change in current at the collector of a first one of said transistors; and
   a load transistor connected to [the] *a* collector of said control transistor and to said output node, said load transistor acting as a resistive path for said control transistor while in one state and acting as a high current source for said control transistor in a second state, and wherein said method includes the step of:
   operating said load transistor [operable] under control of said current change from said first transistor for quickly changing from [on] *one* state to the other.

* * * * *